(12) United States Patent
Kang

(10) Patent No.: US 6,445,729 B1
(45) Date of Patent: Sep. 3, 2002

(54) RADIO SIGNAL TRANSCEIVER APPARATUS

(75) Inventor: Keun-Mo Kang, Inchonkwangyok-shi (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/222,379

(22) Filed: Dec. 29, 1998

(30) Foreign Application Priority Data

Dec. 29, 1997 (KR) ............................................ 97-75971

(51) Int. Cl.[7] ................................................ H04L 5/16
(52) U.S. Cl. .................... 375/219; 375/295; 375/297; 375/345; 330/51
(58) Field of Search ................................ 375/130, 345, 375/316, 219, 295, 297; 455/127, 216; 330/51

(56) References Cited

U.S. PATENT DOCUMENTS

| | | | |
|---|---|---|---|
| 5,222,255 A | * | 6/1993 | Kuo et al. .................... 455/266 |
| 5,661,434 A | * | 8/1997 | Brozovich .................... 330/51 |
| 5,909,643 A | * | 6/1999 | Aihara ........................ 455/127 |
| 6,229,995 B1 | * | 5/2001 | Lee ............................. 455/127 |

* cited by examiner

*Primary Examiner*—Stephen Chin
*Assistant Examiner*—Shuwang Liu
(74) *Attorney, Agent, or Firm*—Dilworth & Barrese, LLP

(57) ABSTRACT

A transceiver apparatus in a code division multiple access system is disclosed. The apparatus includes a low noise amplifier for amplifying a signal received via an antenna, a first filter for extracting components of a usable band from the amplified signal, and a voltage controlled amplifier for amplifying the filtered. A down mixer converts the amplified signal to an intermediate frequency, a second filter eliminates unnecessary waves generated during the conversion operation of the down mixer, and an automatic gain controlled amplifier amplifies the signal filtered by the second filter. A demodulator demodulates the signal amplified by the automatic gain controlled amplifier, and a control unit receives the demodulated signal, and determines the degree of amplification of each amplifier based on the power level of the received signal, and outputs control signals respectively adapted to determine the degree of amplification and whether or not an amplification should be conducted in a drive amplifier, based on the power level of the received signal.

8 Claims, 3 Drawing Sheets

RADIO SIGNAL TRANSCEIVER APPARATUS

BACKGROUND OF THE INVENTION

1. Field of the Invention

The present invention relates to a radio signal transceiver apparatus, and more particularly it relates to a transceiver apparatus capable of achieving an improvement in linearity in code division multiple access (CDMA) systems.

2. Description of the Related Art

Generally, transmitting and receiving systems for radio signals are classified into those of the analog type and those of the digital type. Recently, digital transmitting and receiving systems have mainly been used for radio signals, by virtue of rapid developments of techniques. A representative of such digital systems is a CDMA system. Now, signal transmitting and receiving procedures conducted in a transceiver apparatus of such a digital system will be described.

First, the receiving procedure will be described. An input signal received via an antenna is amplified by a low noise amplifier. The amplified signal is then filtered in order to extract components of a usable band therefrom. The filtered signal is then down converted to an intermediate frequency by a down mixer. The resultant signal is filtered again in order to eliminate unnecessary waves, generated during the down conversion, therefrom. The input signal, which has been filtered at the intermediate frequency, is amplified again and then sent to a demodulator, which, in turn, demodulates the received signal. The demodulator sends the demodulated signal to a digital signal processor (DSP) which, in turn, checks the intensity of the received signal, thereby adjusting the degree of receiving amplification and the degree of transmitting amplification. In such a configuration, however, the down mixer, which conducts a down conversion to the intermediate frequency, may operate abnormally. That is, where a high-intensity signal not intended, for example, an analog cellular signal, is received in the low noise amplifier, the down mixer may be saturated, so that it operates abnormally.

Next, the transmitting procedure will be described. The DSP determines the degree of desired transmitting amplification in accordance with the level of receiving power and sends a signal, to be transmitted, to a modulator which, in turn, modulates the signal. The modulated signal from the modulator is amplified and then filtered to eliminate pseudo components thereof generated during modulation. The filtered signal is converted to a transmitting frequency by an up mixer. The resultant signal from the up mixer is then filtered again to eliminate unnecessary components thereof generated during the conversion to the transmitting frequency. The resultant filtered signal is sent to a drive amplifier which, in turn, amplifies the received signal to a transmitting power level. The degree of amplification of the drive amplifier is set to a fixed value. For this reason, when the transmitting amplifier, which amplifies the modulated signal at the transmitting stage, is adjusted to increase its degree of amplification in order to ensure an interference between adjacent channels required in the CDMA system when the channel is in a degraded state, it may generate a signal amplified in excess of the maximum amplification level of the drive amplifier. In other words, an over amplification may occur in the drive amplifier. In such a case, there is a degradation in the linearity of the signal output from the drive amplifier. Moreover, when such a signal, which is excessively amplified, is output after being amplified by the transmitting amplifier and drive amplifier, a large waste of current is generated because the entire degree of amplification is very high. This results in a reduction in communication time in portable phones.

SUMMARY OF THE INVENTION

Accordingly, an object of the present invention is to provide a transmitter apparatus in a CDMA system which includes a drive amplifier capable of achieving an improvement in linearity.

Another object of the invention is to provide a receiver apparatus in a CDMA system which includes a down mixer configured not to be saturated during a conversion operation thereof to an intermediate frequency.

Another object of the invention is to provide a transmitter apparatus in a portable phone capable of reducing the consumption of current.

In accordance with the present invention, these objects are accomplished by providing a transceiver apparatus in a code division multiple access system comprising: a low noise amplifier for amplifying a signal received via an antenna; a first filter for extracting components of a usable band from said signal amplified by said low noise amplifier; a voltage controlled amplifier for amplifying said signal filtered by said first filter; a down mixer for converting said signal amplified by said voltage controlled amplifier to an intermediate frequency; a second filter for eliminating unnecessary waves, generated during said conversion operation of said down mixer, from said signal converted by said down mixer; an automatic gain controlled amplifier for amplifying said signal filtered by said second filter; a demodulator for demodulating said signal amplified by said automatic gain controlled amplifier; and a control unit for receiving said signal demodulated by said demodulator, and determining an amplification degree of each of said amplifiers in accordance with the power level of said received signal, and outputting control signals respectively adapted to determine the degree of amplification and whether or not amplification should be conducted in a drive amplifier, in accordance with the power level of said received signal, said control unit also outputting a signal to be transmitted. A modulator modulates said signal, to be transmitted, received from said control unit, and an amplifying unit amplifies said signal modulated by said modulator at the degree of amplification determined by said control unit. A third filter eliminates noise components from said signal amplified by said amplifying unit, and an up mixer converts said signal filtered by said third filter to a transmitting band frequency. A fourth filter eliminates unnecessary wave components from said signal converted to said transmitting band frequency. The drive amplifier received said control signal adapted to determine whether or not an amplification should be conducted in said drive amplifier, and amplifies said signal filtered by said fourth filter or served as a transmitting path for said signal filtered by said second filter, in accordance with said control signal received therein.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Figure 1:
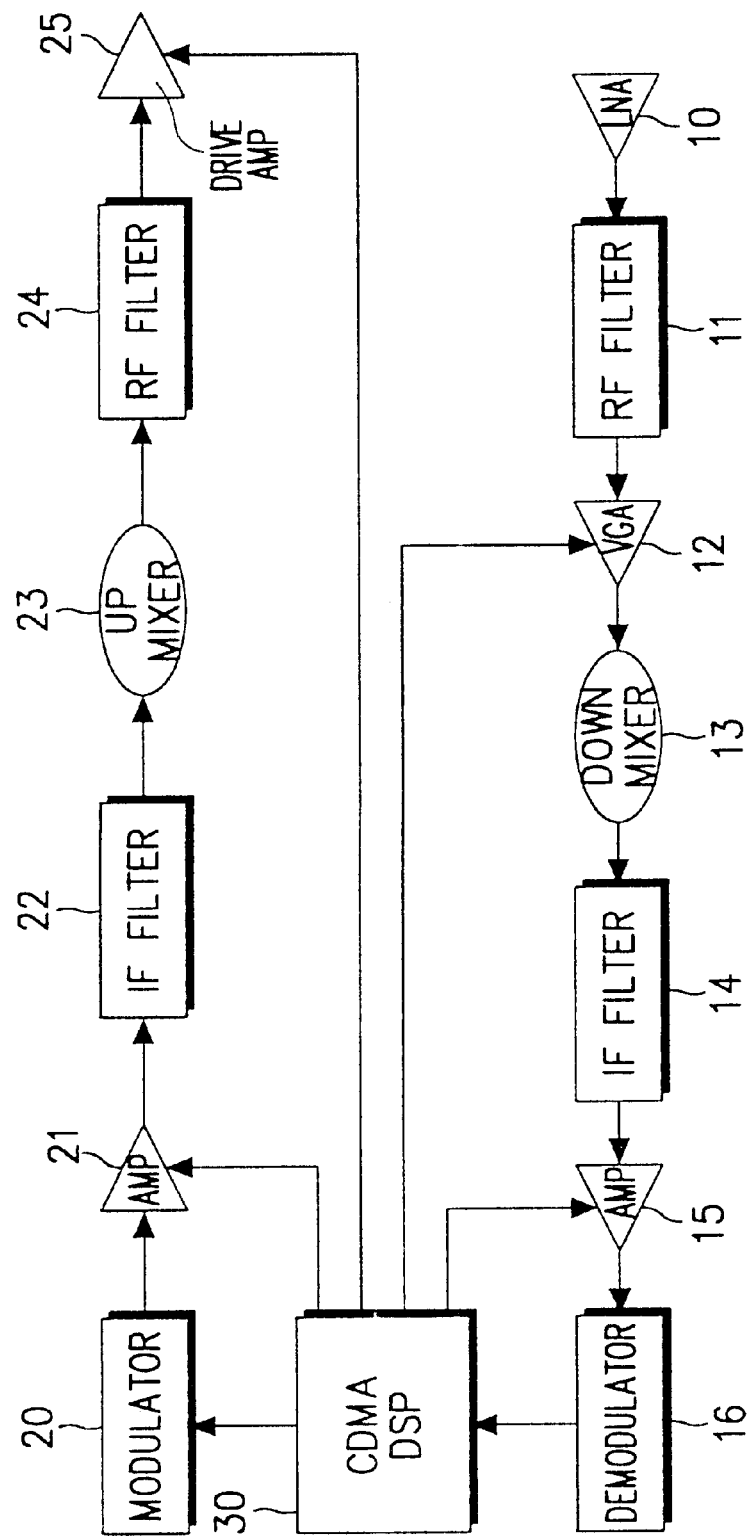
FIG. 1 is a block diagram illustrating the transmitter and receiver apparatus of a portable phone in accordance with a preferred embodiment of the present invention.

Reference will now be made in detail to the preferred embodiments of the present invention. FIG. 1 is a block diagram illustrating the transmitter and receiver apparatus of a portable phone in accordance with a preferred embodiment of the present invention.

First, the receiving operation of the receiver apparatus shown in FIG. 1 according to the present invention will be described. A low noise amplifier 10 amplifiers an input signal received therein via an antenna (not shown) and a duplexer (not shown). The amplified signal from the low noise amplifier 10 is sent to a receiving filter, namely, a radio frequency (RF) filter 11. This RF filter 11 serves to extract receiving band components from the signal amplified by the low noise amplifier 10 and received therein. The RF filter 11 outputs the extracted signal to a voltage controlled amplifier (VGA) 12 which, in turn, amplifies the received signal. The degree of amplification (i.e., the amount of amplification) of the voltage controlled amplifier 12 is determined by a control voltage from a DSP 30 serving to control the receiver apparatus. When a high-intensity signal not intended, for example, an analog cellular signal, is received in the receiver apparatus, the DSP 30 drops the amplification degree of the voltage controlled amplifier 12 so that the resultant signal from the voltage controlled amplifier 12 is output to a down mixer 13. Accordingly, it is possible to prevent the down mixer 13 from being saturated by an analog cellular signal or similar signals. The down mixer 13 down converts the signal output from the voltage controlled amplifier 12, after being amplified, to an intermediate frequency. During such an operation of the down mixer 13 for down converting the signal output from the voltage controlled amplifier 12 to the intermediate frequency, unnecessary waves are generated in addition to the intermediate frequency signal. Accordingly, such unnecessary waves are eliminated by a receiving IF filter 14. The resultant signal from the receiving IF filter 14 is then sent to an automatic gain controlled amplifier 15. This automatic gain controlled amplifier 15 determines its degree of amplification in accordance with a gain control signal from the DSP 30 and then amplifies the signal received therein in accordance with the determined degree of amplification. The resultant signal from the automatic gain controlled amplifier 15 is sent to a demodulator 16 which, in turn, demodulates the received, encoded signal. The demodulator 16 outputs data about the level of the received signal and demodulated data to the DSP 30. In accordance with the present invention, the voltage controlled amplifier 12 is arranged upstream from the down mixer 13 serving to conduct a down conversion for the received signal to the intermediate frequency, so that it adjusts the intensity of the signal input to the down mixer 13. Accordingly, it is possible to prevent the down mixer 13 from being saturated.

Next, the transmitting operation of the transmitter apparatus shown in FIG. 1 according to the present invention will be described. The DSP 30 determines a desired degree of amplification in accordance with the level of the signal received at the receiving stage. A modulator 20 receives a signal, to be transmitted, from the DSP 30 and modulates the received signal. A transmitting amplifier 21 amplifies the modulated signal from the modulator 20 in accordance with the degree of amplification determined by the DSP 30. During the modulation operation of the modulator 20, unnecessary waves may be generated. In order to eliminate such unnecessary waves, the modulated signal is sent to a transmitting IF filter 22 after being amplified by the transmitting amplifier 21. The transmitting IF filter 22 extracts components, to be transmitted, from the signal received therein. An up mixer 23, which is coupled to the transmitting IF filter 22, conducts an up conversion to a transmitting band for the filtered signal output from the transmitting IF filter 22. Unnecessary waves may also be generated during the up conversion conducted by the up mixer 23. In order to eliminate such unnecessary waves, accordingly, the output signal from the up mixer 23 is sent to a transmitting RF filter 24. This transmitting RF filter 24 eliminates unnecessary wave components from the signal received from the up mixer 23 and outputs the resultant signal to a drive amplifier 25. In accordance with a control signal from the DSP 30, the drive amplifier 25 conducts amplification or serves as a transmitting path involving no amplification for the signal received from the transmitting RF filter 24.

The degree of amplification of the transmitting signal is determined by the power intensity of the signal received from the receiving apparatus. That is, where the power intensity of the signal received from the receiving apparatus is equal to or higher than a predetermined threshold value, the transmitting apparatus normally amplifies the received signal through the entire amplification procedure. However, if the power intensity of the received signal is lower than the predetermined threshold value, for example, where it is very weak, the degree of amplification at the transmitting amplifier 21 is increased to a very high value. If the signal amplified at such a very high degree of amplification is amplified in the transmitting apparatus, a signal is then generated which has a level exceeding the maximum amplification degree of the drive amplifier 25. In such a case, the resultant signal output from the drive amplifier 25 may involve a distortion phenomenon. In accordance with the present invention, therefore, the drive amplifier 25 is controlled based on the power intensity of the received signal from the receiving apparatus. That is, the drive amplifier 25 outputs, at an antenna (not shown) via a duplexer (not shown), after amplifying the signal received from the transmitting RF amplifier 24 or only establishes a transmitting path without any amplification, in accordance with the power intensity of the signal received from the receiving apparatus.

Figure 2:
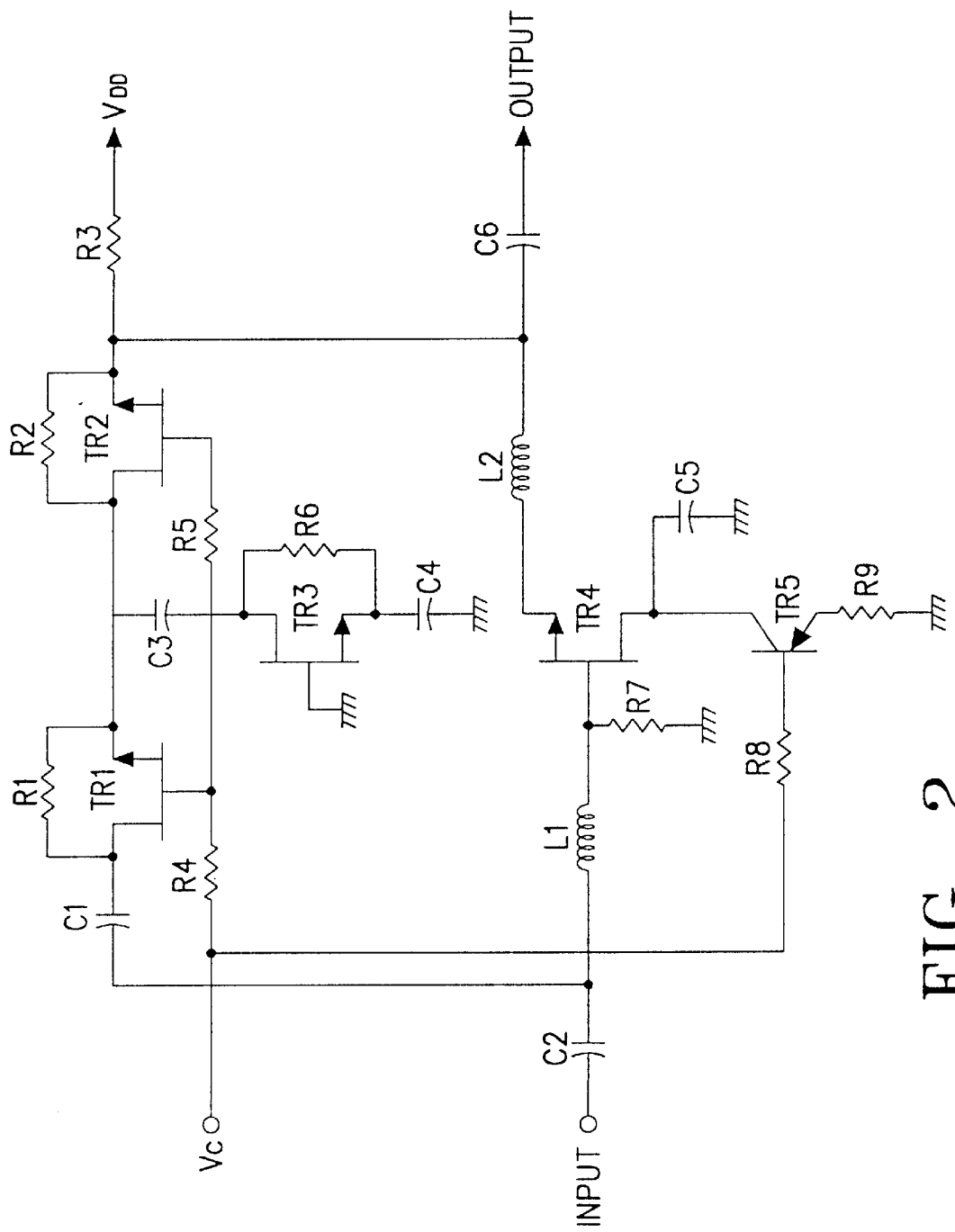
FIG. 2 is a circuit diagram illustrating a drive amplifier configured in accordance with an embodiment of the present invention.

FIG. 2 is a circuit diagram illustrating a drive amplifier configured in accordance with an embodiment of the present invention. The configuration and operation of the drive amplifier will now be described in conjunction with FIGS. 1 and 2. First, the configuration of the drive amplifier shown in FIG. 2 will be described. Referring to FIG. 2, a control terminal Vc is shown which receives, from the DSP 30 of FIG. 1, a control signal for determining whether or not amplification should be conducted in the drive amplifier. An input terminal Input is coupled to the output terminal of the transmitting RF filter 24. An output terminal Output is coupled to the duplexer (not shown). A MOSFET TR4, namely, a fourth transistor, is coupled at the gate thereof to the input terminal Input via a capacitor C2, namely, a second capacitor, and a first coil L1. A node between the first coil L1 and the fourth transistor TR4 is grounded via a resistor R7, namely, a seventh resistor. The drain of the fourth transistor TR4 is also connected to the output terminal Output via a second coil L2 and a sixth capacitor C6 and the source of TR4 is connected to the collector of a fifth transistor TR5 which is a bipolar transistor. The emitter of the fifth transistor TR5 is grounded via a ninth resistor R9. The base of the fifth transistor TR5 is also coupled to an eighth resistor R8 connected to the control terminal Vc.

The collector of the fifth transistor TR5 is also grounded via a fifth capacitor C5. A first capacitor C1 is coupled at one side thereof to a node between the second capacitor C2 connected to the input terminal Input and the first coil L1 and at the other side thereof to the source of a first transistor TR1. The gate of the first transistor TR1 is connected to the control terminal Vc via a fourth resistor R4 and at the drain thereof to the source of a second transistor TR2. A first resistor R1 is connected in parallel between the drain and source of the first transistor TR1. The gate of the second transistor TR2 is connected to the gate of the first transistor TR1 via a fifth resistor R5 and at the drain thereof to a node between the second coil L2 and the sixth capacitor C6. The drain of the second transistor TR2 is also coupled to an external voltage source $V_{DD}$. A second resistor R2 is connected in parallel between the source and drain of the second transistor TR2. A node between the drain of the first transistor TR1 and the source of the second transistor TR2 is coupled to the source of a third transistor TR3 via a third capacitor C3. The gate of the third transistor TR3 is grounded and at the drain thereof is also grounded via a fourth capacitor C4. A sixth resistor R6 is connected in parallel between the source and drain of the third transistor TR3.

Now, the operation of the drive amplifier having the above configuration will be described. When a high level signal is applied to the control terminal Vc of the drive amplifier, it is sent to the base of the fifth transistor TR5 via the resistor R8. As a result, the fifth transistor TR5 is reversely biased, so that it is switched to its OFF state. At the OFF state of the fifth transistor TR5, the fourth transistor TR4 is rendered to a floating state. Accordingly, current flow through the fourth transistor TR4 is prevented. Meanwhile, the first transistor TR1, which serves as a switch, receives voltage of a high level at the gate thereof while receiving, at the drain thereof, a supply voltage from the external voltage source $V_{DD}$ via the third and second resistors R3 and R2. As a result, the first transistor TR1 is switched to its ON state. The second transistor TR2 is also switched to its ON state because of the voltage applied from the control terminal Vc at the gate thereof and the supply voltage from the external voltage source $V_{DD}$ at the drain thereof. In such a state, when a high level signal is applied to the control terminal Vc, a path for an input signal received at the input terminal Input is established which extends between the input terminal Input and the output terminal Output via the coupling capacitors C2 and C1 serving to prevent introduction of direct current, and then the transistors TR1 and TR2, serves as a switch. The third transistor TR3 performs an operation for controlling the balance between the first and second transistors TR1 and TR2. Thus, the drive amplifier operates simply as an output path for the filtered signal received therein without any amplification.

When the signal applied to the control terminal Vc of the drive amplifier has a low level, it is first sent to the base of the fifth transistor TR5 via the resistor R8. As a result, the fifth transistor TR5 is forwardly biased, so that it is switched to its ON state. At the ON state of the fifth transistor TR5, the fourth transistor TR4 turns on, so that it serves as an amplifier. The low level signal from the control terminal Vc is also applied to the gate of the first transistor TR1 which also receives, at the drain thereof, the supply voltage from the external voltage source $V_{DD}$. As a result, the first transistor TR1 is switched to its OFF state. In this case, the second transistor TR2 is also switched to its OFF state, as in the case of the first transistor TR1. Accordingly, the input signal received at the input terminal Input is output to the output terminal Output after being amplified by the fourth transistor TR4.

Figure 3:
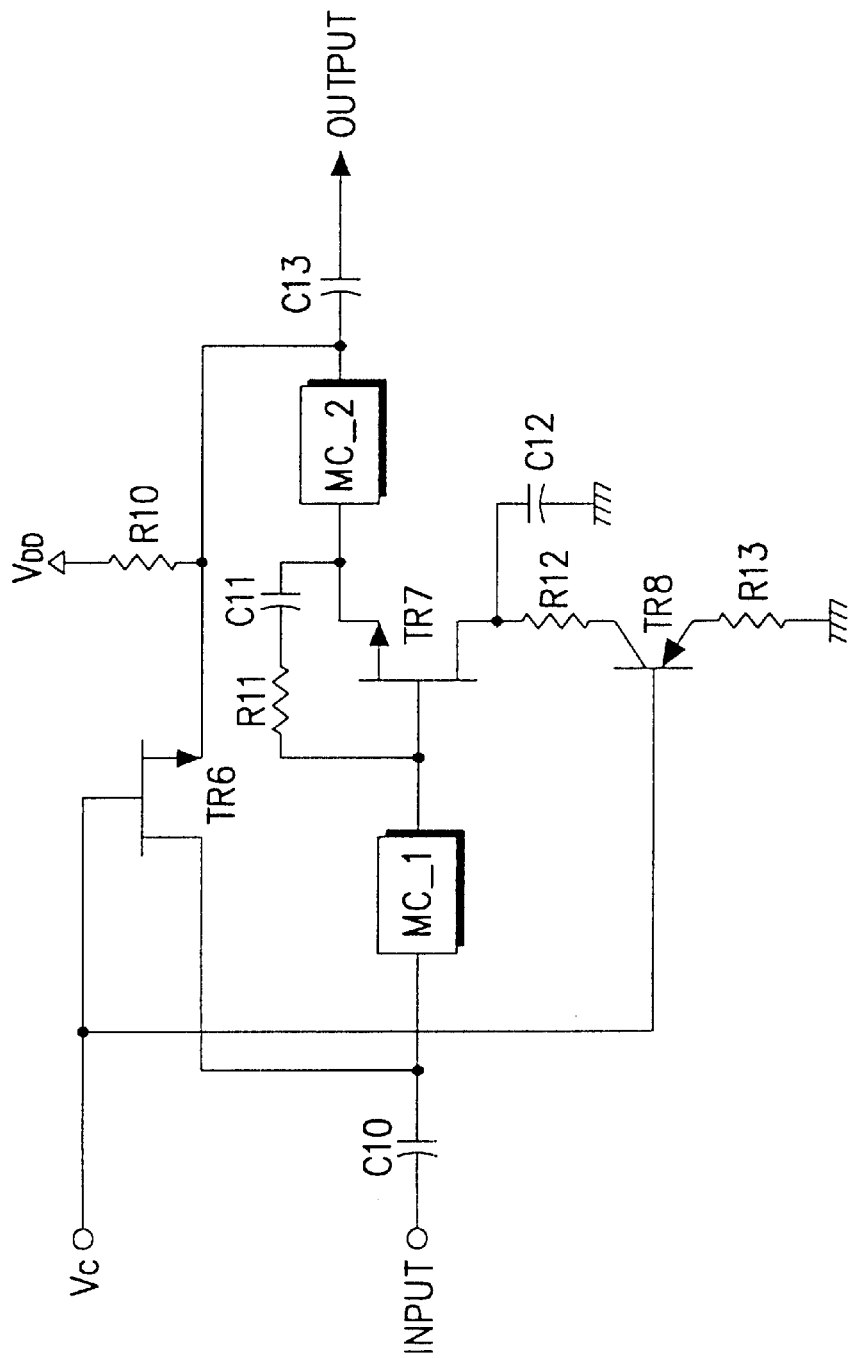
FIG. 3 is a circuit diagram illustrating a drive amplifier configured in accordance with another embodiment of the present invention.

FIG. 3 is a circuit diagram illustrating a drive amplifier configured in accordance with another embodiment of the present invention.

The configuration and operation of the drive amplifier will now be described in conjunction with FIG. 3. First, the configuration of the drive amplifier shown in FIG. 3 will be described. An input terminal Input is coupled to a first matching unit MC_1 via the input of a tenth capacitor C10. The output of the first matching unit MC_1 is connected to the gate of a seventh transistor TR7. The source of the seventh transistor TR7 is grounded via a twelfth capacitor C12 and the drains is coupled to the input of a second matching unit MC_2. The source of the seventh transistor TR7 is coupled to the collector of an eighth transistor TR8 via a twelfth resistor R12. A node between the gate of the seventh transistor TR7 and the output of the first matching unit MC_1 is connected to the drain of the seventh transistor TR7 via an eleventh resistor R11 and an eleventh capacitor C11. The emitter of the eighth transistor TR8 is grounded via a thirteenth resistor R13 and the base is coupled to a control terminal Vc. The drain of the seventh transistor TR7 is connected to an output terminal Output via the second matching unit MC_2 and a thirteenth capacitor C13. A node between the tenth capacitor C10 and the first matching unit MC_1 is coupled to the source of a sixth transistor TR6. The gate of the sixth transistor TR6 is coupled to the control terminal Vc and the drain is connected to the output of the second matching unit MC_2. The drain of the sixth transistor TR6 is also connected to an external voltage source $V_{DD}$ via a tenth resistor R10.

Now, the operation of the drive amplifier having the above configuration will be described. First, a description will be made in conjunction with the case in which a high level signal is applied to the control terminal Vc of the drive amplifier. When a high level signal received at the control terminal Vc of the drive amplifier is applied to the base of the eighth transistor TR8, this eighth transistor TR8 is switched to its OFF state. At the OFF state of the eighth transistor TR8, the seventh transistor TR7 is rendered to a floating state. Meanwhile, the sixth transistor TR6 receives the high level voltage at the gate thereof while receiving, at the drain thereof, a supply voltage from the external voltage source VDD via the tenth resistor R10. As a result, the sixth transistor TR6 turns on. In this state, the input signal received at the input terminal Input is filtered to remove direct current components therefrom while passing through the tenth capacitor C10. Thereafter, the input signal is output to the output terminal Output via the sixth transistor TR6 which is in its ON state.

Next, a description will be made in conjunction with the case in which a low level signal is applied to the control terminal Vc of the drive amplifier. When a low level signal received at the control terminal Vc is applied to the base of the eighth transistor TR8, this eighth transistor TR8 is forwardly biased. As a result, the eighth transistor TR8 is switched to its OFF state, thereby causing the seventh transistor TR7 to turn on. Accordingly, the degree of amplification of the drive amplifier is determined by the resistor R11 and capacitor C11 which determine a feedback value. Thus, the input signal received at the input terminal Input is amplified by the seventh transistor TR7 via the first matching unit MC_1 and then output to the output terminal Output via the second matching unit MC_2 and thirteenth capacitor C13.

As is apparent from the above description, the transmitter apparatus according to the present invention includes a drive amplifier which serves to conduct an amplification for an output signal therefrom or serves as an output path involving no amplification. By virtue of such a drive amplifier, there is no over amplification for the output signal. Accordingly, the present invention provides an advantage in that the output signal maintains linearity without involving any distortion. Where the present invention is applied to a portable phone, such a selective amplification results in a reduced consumption of electric power in the transmitter part. Accordingly, it is possible to lengthen the communication time of the portable phone. Furthermore, the receiver apparatus according to the present invention is configured to adjust the level of a signal received via a voltage controlled amplifier prior to a conversion of the received signal to an intermediate frequency. By such a configuration, it is possible to prevent a down mixer included in the receiver apparatus from being saturated.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A receiver apparatus in a code division multiple access system comprising:

a low noise amplifier for amplifying a signal received via an antenna;

a first filter for extracting components of a usable band from said signal amplified by said low noise amplifier;

a voltage controlled amplifier for amplifying said signal filtered by said first filter;

a down mixer for converting said signal amplified by said voltage controlled amplifier to an intermediate frequency;

a second filter for eliminating unnecessary waves from said signal converted by said down mixer, generated during said conversion operation of said down mixer;

an automatic gain controlled amplifier for amplifying said signal filtered by said second filter;

a demodulator for demodulating said signal amplified by said automatic gain controlled amplifier; and a control unit for receiving said signal demodulated by said demodulator, and determining a degree of amplification of each of said amplifiers in accordance with a power level of said received signal.

2. A transmitter apparatus in a code division multiple access system comprising:

a control unit for outputting control signals respectively adapted to determine a degree of amplification degree and whether or not amplification should be conducted in a drive amplifier, in accordance with the power level of an input signal, said control unit also outputting a signal to be transmitted;

a modulator for modulating said signal to be transmitted received from said control unit;

an amplifying unit for amplifying said modulated signal at the determined degree of amplification;

a first filter for eliminating noise components from said amplified signal;

an up mixer for converting said signal filtered by said first filter to a transmitting band frequency; and a second filter for eliminating unnecessary wave components from said signal converted to said transmitting band frequency;

wherein said drive amplifier receives said control signal adapted to determine whether or not amplification should be conducted in said drive amplifier, and amplifies said signal filtered by said second filter or serves as a transmitting path for said signal filtered by said second filter, in response to said received control signal.

3. The transmitter apparatus in accordance with claim 2, wherein said drive amplifier comprises:

an amplifier for amplifying said signal filtered by the second filter;

a first switch for turning on or off said amplifier in accordance with said control signal; and a second switch adapted to operate reversely to said first switch in accordance with said control signal received, said second switch turning on at an OFF state of said first switch, thereby coupling said input signal to an output stage.

4. The transmitter apparatus in accordance with claim 3, wherein said amplifier comprises a transistor having a gate coupled to said input signal, a drain coupled to a signal at said output stage, and a source coupled to said first switch and grounded via said first switch.

5. The transmitter apparatus in accordance with claim 4, wherein said first and second switches comprise first and second transistors, respectively;

said first transistor having a base coupled to said control unit, a grounded emitter, and a collector coupled to said transistor source of said amplifier, said first transistor controlling turn-on and turn-off operations of said amplifier; and said second transistor having a gate coupled to said control unit, a source coupled to an input stage to which said input signal is applied, and a drain coupled to said output stage.

6. The transmitter apparatus in accordance with claim 2, wherein said drive amplifier comprises:

a first transistor adapted to amplify an input signal applied to an input stage, said first transistor having a gate connected to said input signal, a drain connected to an output stage, and a source connected to a collector of a second transistor;

a second transistor adapted to control said first transistor between a floating state and a turn-on state in accordance with a switching operation thereof, said second transistor having a base connected to said control unit, and a grounded emitter;

a third transistor adapted to couple said input signal to said output stage at said floating state of said first transistor in accordance with a switching operation thereof, said third transistor having a source connected to said input stage, a gate connected to said control unit, and a drain connected to a source of a fourth transistor; and a fourth transistor adapted to couple said input signal to said output stage at said floating state of said first transistor in accordance with a switching operation thereof, said fourth transistor having a gate connected to said control unit, and a drain connected to said output stage.

7. The transmitter apparatus in accordance with claim 6, further comprising:

a fifth transistor coupled between said drain of said third transistor and said source of said fourth transistor, said fifth transistor adjusting a balance between said third and fourth transistors.

8. A transceiver apparatus in a code division multiple access system comprising:
- a low noise amplifier for amplifying a signal received via an antenna;
- a first filter for extracting components of a usable band from said signal amplified by said low noise amplifier;
- a voltage controlled amplifier for amplifying said signal filtered by said first filter;
- a down mixer for converting said signal amplified by said voltage controlled amplifier to an intermediate frequency;
- a second filter for eliminating unnecessary waves generated during said conversion operation of said down mixer from said signal converted by said down mixer;
- an automatic gain controlled amplifier for amplifying said signal filtered by said second filter;
- a demodulator for demodulating said signal amplified by said automatic gain controlled amplifier; and
- a control unit for receiving said demodulated signal, and determining a degree of amplification for each of said amplifiers in response with a power level of said received signal, and outputting control signals respectively adapted to determine the degree of amplification and whether or not amplification should be conducted in a drive amplifier, in response to the power level of said received signal, said control unit also outputting a signal to be transmitted;
- a modulator for modulating said signal to be transmitted received from said control unit;
- an amplifying unit for amplifying said modulated signal at said amplification degree determined by said control unit;
- a third filter for eliminating noise components from said signal amplified by said amplifying unit;
- an up mixer for converting said signal filtered by said third filter to a transmitting band frequency;
- a fourth filter for eliminating unnecessary wave components from said signal converted to said transmitting band frequency; and
- said drive amplifier for receiving said control signal adapted to determine whether or not amplification should be conducted in said drive amplifier, and amplifying said signal filtered by said fourth filter or serving as a transmitting path for said signal filtered by said second filter, in response to said received control signal.

* * * * *